(12) United States Patent
Wang et al.

(10) Patent No.: US 12,389,719 B2
(45) Date of Patent: Aug. 12, 2025

(54) LIGHT EMITTING DIODE DEVICE

(71) Applicant: XIAMEN SAN'AN OPTOELECTRONICS CO., LTD., Xiamen (CN)

(72) Inventors: Huining Wang, Xiamen (CN); Linhua Cao, Xiamen (CN); Hongwei Xia, Xiamen (CN); Chunlan He, Xiamen (CN); Lili Jiang, Xiamen (CN); Su-Hui Lin, Xiamen (CN); Renlong Yang, Xiamen (CN); Chung-Ying Chang, Xiamen (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 481 days.

(21) Appl. No.: 18/049,017

(22) Filed: Oct. 24, 2022

(65) Prior Publication Data
US 2023/0132270 A1 Apr. 27, 2023

(30) Foreign Application Priority Data
Oct. 26, 2021 (CN) .......................... 202111250377.9

(51) Int. Cl.
*H10H 20/831* (2025.01)
*H10H 20/841* (2025.01)

(52) U.S. Cl.
CPC ........ *H10H 20/831* (2025.01); *H10H 20/841* (2025.01)

(58) Field of Classification Search
CPC ............ H10H 20/8312; H10H 20/831; H10H 20/841; H10H 20/84; H10H 20/8162; H10H 20/835
See application file for complete search history.

(56) References Cited

U.S. PATENT DOCUMENTS

| 2017/0077354 A1* | 3/2017 | Lee | H10H 20/8162 |
| 2017/0179343 A1* | 6/2017 | Chou | H10H 20/8162 |
| 2017/0186914 A1* | 6/2017 | Kitahama | H10H 20/832 |

* cited by examiner

*Primary Examiner* — Moazzam Hossain
(74) *Attorney, Agent, or Firm* — Muncy, Geissler, Olds & Lowe, P.C.

(57) ABSTRACT

An LED device includes an epitaxial layered structure that includes a first semiconductor layer, a light emitting layer and a second semiconductor layer, first and second electrodes that are disposed on the epitaxial layered structure, and an insulating structure. The first electrode includes a first body portion and a first extending portion connected together. The first extending portion includes a first part and multiple second parts. A projection of the first part on the first semiconductor layer does not overlap a projection of the insulating structure on the first semiconductor layer. The first part has a first sub-part and multiple second sub-parts. A projection of the first sub-part on the first semiconductor layer has a first length, and a projection of each of the second sub-parts on the first semiconductor layer independently has a second length measured in the same direction. The first length is greater than the second length.

19 Claims, 15 Drawing Sheets

LIGHT EMITTING DIODE DEVICE

CROSS-REFERENCE TO RELATED APPLICATION

This application claims priority to Chinese Invention Patent Application No. 202111250377.9, filed on Oct. 26, 2021. The entire content of the Chinese patent application is incorporated herein by reference.

FIELD

The disclosure relates to a semiconductor device, and more particularly to a light emitting diode device.

BACKGROUND

A light emitting diode (LED) is a semiconductor device that emits light by releasing energy when charge carriers recombine. Since LED chips offer several advantages such as low power consumption, pure color, long lifespan, small size, fast response time, energy saving and environmental protection, they are widely applied in fields of lighting, visible light communication and display. In general, the LED chips may have a lateral structure, a flip-chip structure or a vertical structure.

In a current LED chip, a relatively higher concentration of charge carriers tend to accumulate at connected regions between metal pad(s) and finger electrode(s), which may cause electrical over stress (EOS). Therefore, these connected regions may be particularly prone to burnout, which may cause the conventional LED chip to exhibit reduced performance or be damaged entirely.

In addition, the current LED chip is not specifically designed to include an insulating dielectric structure having a modified dimension. For example, in a case where the insulating dielectric structure of the LED chip includes multiple separated current blocking layers disposed on an epitaxial structure of the LED chip, neither the length of one of the current blocking layers located at a side proximal to an N type-GaN layer of the epitaxial structure nor the distance between adjacent ones of the current blocking layers is designed properly. If the length of the one of current blocking layers is too long, the contact area between the N type-GaN layer and the metal electrode may be reduced, causing high operating voltage and reduced performance of the LED chip. If the distance between the adjacent ones of the current blocking layers is too long, the overall area of projections of the current blocking layers on the N type-GaN layer may be reduced, which causes a reflecting region cooperatively formed by the current blocking layers and the metal electrode disposed thereon to also reduce in terms of area, resulting in a decrease in the brightness of the LED chip.

SUMMARY

Therefore, an object of the disclosure is to provide a light emitting diode (LED) device that can alleviate at least one of the drawbacks of the prior art.

According to the disclosure, the LED device includes an epitaxial layered structure, first and second electrodes that are disposed on the epitaxial layered structure, and an insulating structure. The epitaxial layered structure includes a first semiconductor layer, a light emitting layer and a second semiconductor layer sequentially disposed in such an order along a first direction. The first electrode is electrically connected to the first semiconductor layer and includes a first body portion and a first extending portion connected to the first body portion. The second electrode is electrically connected to the second semiconductor layer and includes a second body portion and at least one second extending portion connected to the second body portion. The first extending portion extends from the first body portion toward the second body portion. The second extending portion extends from the second body portion of the second electrode toward the first body portion. The insulating structure is disposed between the first semiconductor layer and the first electrode, and between the second semiconductor layer and the second electrode. A portion of the insulating structure is disposed at a location corresponding to a region beneath where the second body portion and the second extending portion are connected to each other.

The first extending portion includes a first part and a plurality of second parts. A projection of the first part on the first semiconductor layer does not overlap a projection of the insulating structure on the first semiconductor layer, and a projection of each of the second parts entirely overlaps the projection of the insulating structure on the first semiconductor layer. The first part has a first sub-part that is located between the first body portion and one of the second parts closest to the first body portion, and a plurality of second sub-parts that are separated from one another by the second parts.

A projection of the first sub-part on the first semiconductor layer has a first length measured in a second direction perpendicular to the first direction on the first semiconductor layer, and a projection of each of the second sub-parts on the first semiconductor layer independently has a second length measured in the second direction. The first length is greater than the second length.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
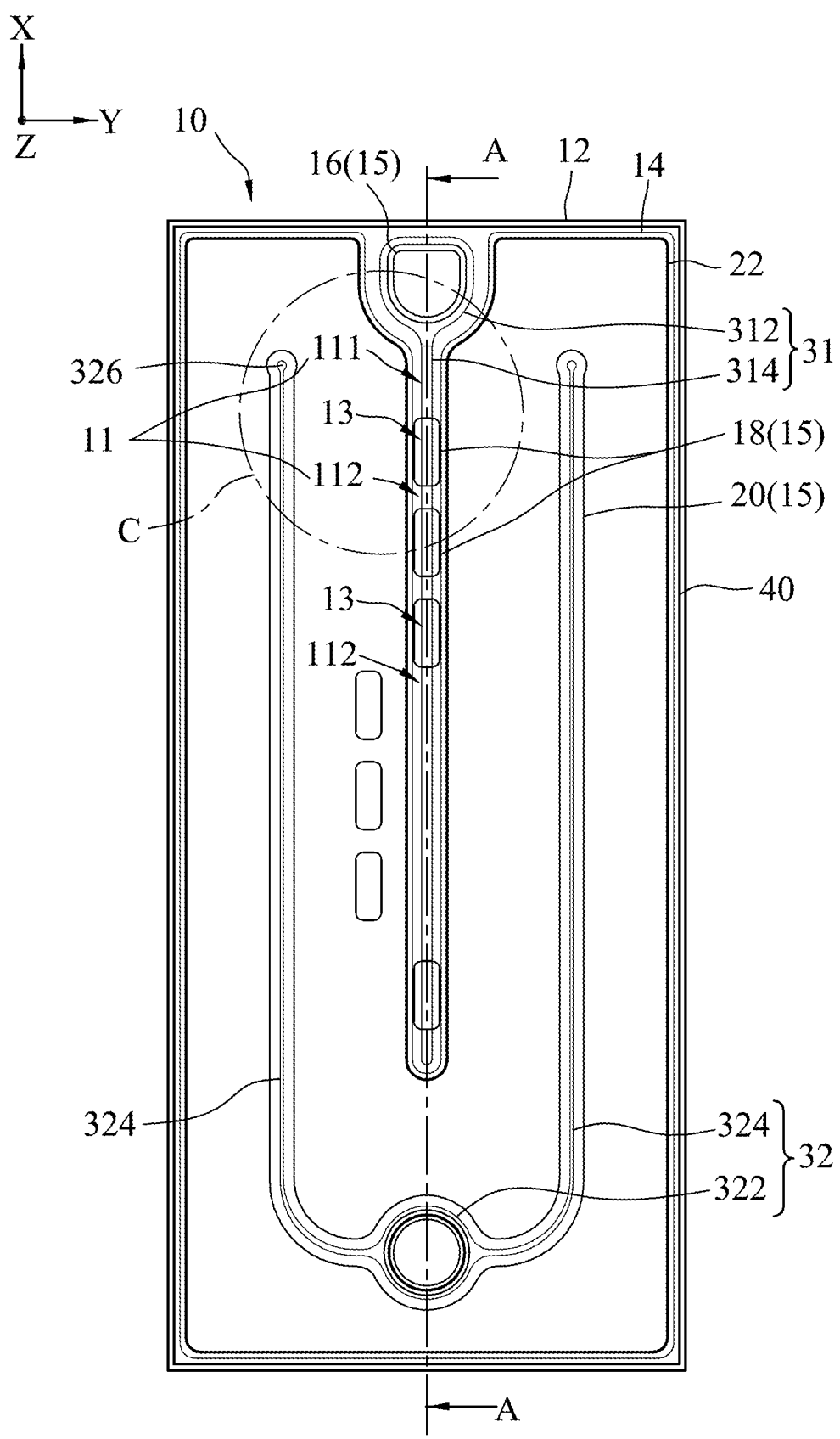
FIG. 1 is a schematic top view illustrating a first embodiment of a light emitting diode (LED) device according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

It should be noted herein that for clarity of description, spatially relative terms such as "top," "bottom," "upper," "lower," "on," "above," "over," "beneath," "downwardly," "upwardly" and the like may be used throughout the disclosure while making reference to the features as illustrated in the drawings. The features may be oriented differently (e.g., rotated 90 degrees or at other orientations) and the spatially relative terms used herein may be interpreted accordingly.

Figure 2:
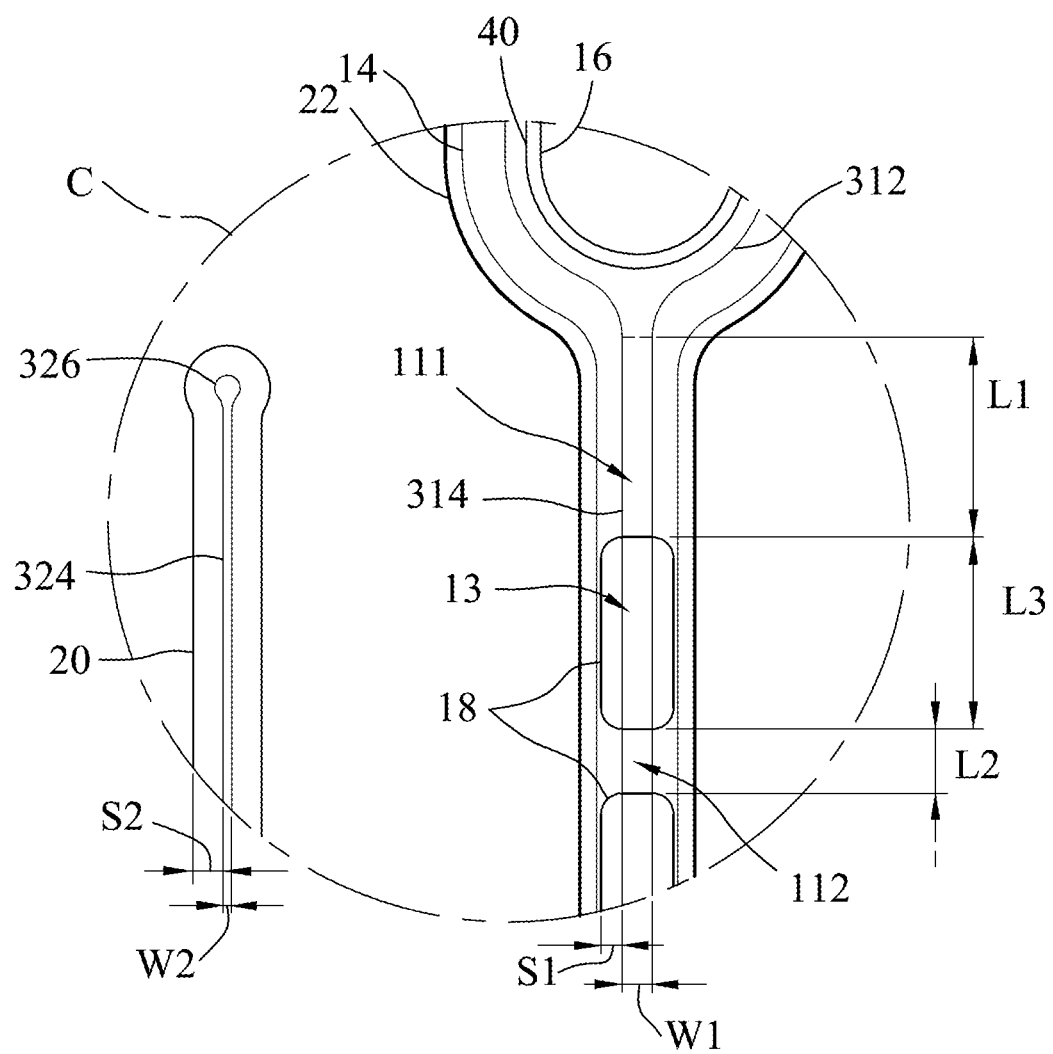
FIG. 2 is an enlarged view of a circular region C of FIG. 1.
Figure 3:
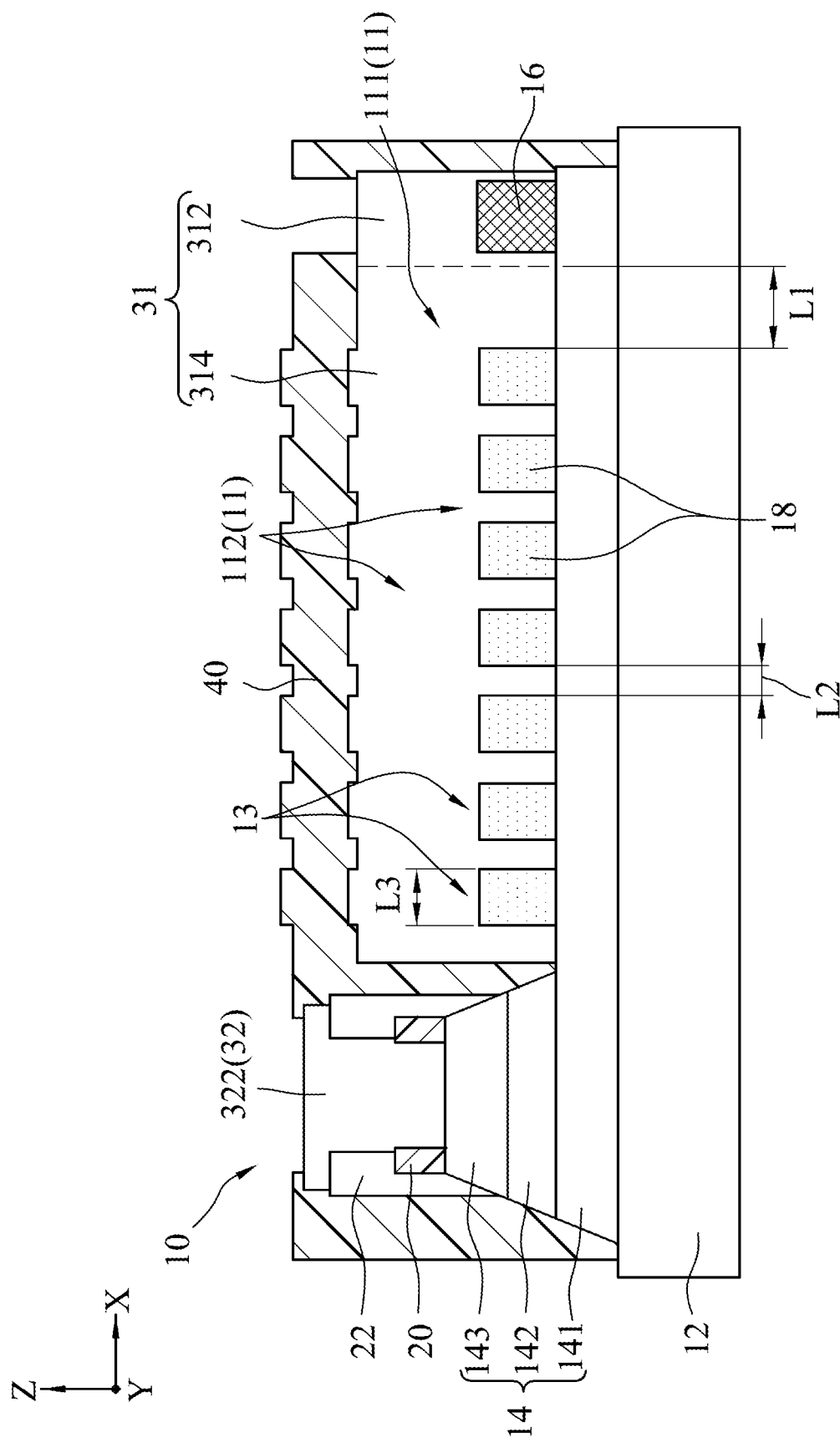
FIG. 3 is a schematic sectional view taking along a line A-A of FIG. 1.

Referring to FIGS. 1 to 3, a first embodiment of a light emitting diode (LED) device 10 according to the disclosure includes a substrate 12, an epitaxial layered structure 14, a first electrode 31, a second electrode 32 and an insulating structure 15.

The epitaxial layered structure 14 is disposed on the substrate 12. The substrate 12 may be a light-transmissible substrate, an opaque substrate or a semi-transparent substrate. In a case of the substrate 10 being a light-transmissible or semi-transparent substrate, light emitted from the epitaxial layered structure 14 may pass through the substrate 12 and reach a side of the substrate 12 opposite to the epitaxial layered structure 14. The substrate 12 may be, but is not limited to, a flat sapphire substrate, a patterned sapphire substrate, a silicon substrate, a silicon carbide substrate, a gallium nitride substrate or a glass substrate.

In certain embodiments, the substrate 12 is a patterned substrate that a protruding configuration (not shown), which may be a monolayer structure or a multi-layered structure containing at least one light extraction layer, is disposed on. The light extraction layer may have a refractive index lower than that of the substrate 12, and a thickness that is greater than half of a height of the protruding configuration, which may enhance the light exiting efficiency of the LED device 10. In certain embodiments, the protruding configuration may be formed as a dome-shaped structure, and the refractive index of the light extraction layer may be smaller than 1.6. For example, the light extraction layer may be made of silicon dioxide ($SiO_2$). In certain embodiments, the substrate 12 may be thinned or removed so as to form a thin film-type LED chip.

The epitaxial layered structure 14 includes a first semiconductor layer 141, a light emitting layer 142 and a second semiconductor layer 143 sequentially disposed in such order along a first direction (Z).

The first semiconductor layer 141 may be doped with n-type dopants. For example, the first semiconductor layer 141 may be, but is not limited to, a gallium nitride (GaN)-based semiconductor layer doped with silicon (Si). In certain embodiments, the epitaxial layered structure 14 further includes a buffer layer (not shown) that is disposed between the first semiconductor layer 141 and the substrate 12. In certain embodiments, the first semiconductor layer 141 may be connected to the substrate 12 through a bonding layer (not shown).

The light emitting layer 142 may have a quantum well (QW) structure. In certain embodiments, the light emitting layer 142 may have a multiple quantum well (MQW) structure that includes multiple well layers and multiple barrier layers alternately and repetitively stacked. Additionally, the wavelength of the light emitted by the light emitting layer 142 may be determined by the composition and the thickness of the well layers. That is to say, by adjusting the composition of the well layers and the barrier layers, the light emitting layer 142 may emit different colors of light, such as ultraviolet light, blue light or green light.

The second semiconductor layer 143 may be a semiconductor layer doped with p-type dopants. For example, the second semiconductor layer 143 may be, but is not limited to, a GaN-based semiconductor layer doped with magnesium (Mg). Each of the first semiconductor layer 141 and the second semiconductor layer 143 may have a monolayer structure or a multi-layered structure that includes a superlattice layer. In certain embodiments, the first semiconductor layer 141 may be doped with p-type dopants and the second semiconductor layer 143 may be doped with n-type dopants.

The first electrode 31 is disposed on the epitaxial layered structure 14 and is electrically connected to the first semiconductor layer 141. The second electrode 32 is disposed on the epitaxial layered structure 14 and is electrically connected to the second semiconductor layer 143. Each of the first electrode 31 and the second electrode 32 may include a highly electrically conductive metal layer that is made of aluminum (Al), copper (Cu), silver (Ag), gold (Au), platinum (Pt), any combinations thereof or other metalloids, which has high reflectivity.

The first electrode 31 includes a first body portion 312 and a first extending portion 314 connected to the first body portion 312. In FIGS. 2 and 3, the first body portion 312 and the first extending portion 314 are separated by a dotted line. The second electrode 32 includes a second body portion 322 and at least one second extending portion 324 connected to the second body portion 322. The first extending portion 314 extends from the first body portion 312 toward the second electrode 32. In certain embodiments, the first extending portion 314 linearly extends from the first body portion 312 toward the second body portion 322 of the second electrode 32 (i.e., in a second direction (X) perpendicular to the first direction (Z) on the first semiconductor layer 141). In this embodiment, a projection of the first extending portion 314 is in a strip form. The second extending portion 324 extends from the second body portion 322 of the second electrode 32 toward the first body portion 312.

In this embodiment, the second electrode 32 includes two second extending portions 324, which are connected to two opposite sides of the second body portion 322. Each of the second extending portions 324 extends from the second body portion 322 toward the first body portion 312. In certain embodiments, the second extending portions 324 are parallel to each other, and a projection of the first extending portion 314 on the first semiconductor layer 141 is located between projections of the second extending portions 324 on the first semiconductor layer 141 along a third direction (Y) that is perpendicular to the first direction (Z). The projection of the first extending portion 314 on the first semiconductor layer 141 has a first width (W1) measured in the third direction (Y) on the first semiconductor layer 141, and each of the projections of the second extending portions 324 on the first semiconductor layer 141 has a second width (W2) measured in the third direction (Y). The first width (W1) is greater than the second width (W2). With this arrangement, the potential difference across the LED device 10 may be reduced and the reliability of the LED device 10 may be increased.

The insulating structure 15 is disposed on the epitaxial layered structure 14. Specifically, the insulating structure 15 is disposed between the first semiconductor layer 141 and the first electrode 31, and between the second semiconductor layer 143 and said second electrode 32. The first extending portion 314 includes a first part 11 and a plurality of second parts 13. A projection of the first part 11 on the first semiconductor layer 141 does not overlap a projection of the insulating structure 15 on the first semiconductor layer 141. A projection of each of the second parts 13 entirely overlaps the projection of the insulating structure 15 on the first semiconductor layer 141. Furthermore, the first part 11 has a first sub-part 111 that is located between the first body portion 312 and one of the second parts 13 closest to the first body portion 312, and a plurality of second sub-parts 112 that are separated from one another by the second parts 13. The second sub-parts 112 and the second parts 13 are arranged in an alternate manner. A projection of the first sub-part 111 on the first semiconductor layer 141 has a first length (L1) measured in the second direction (X) perpendicular to the first direction (Z) on the first semiconductor layer 141, and a projection of each of the second sub-parts 112 on the first semiconductor layer 141 independently has a second length (L2) measured in the second direction (X). The first length (L1) is greater than the second length (L2). By having the first length (L1) be greater than the second length (L2), a region where charge carriers are accumulated (i.e, the first sub-part 111) may have a sufficient contact area for contacting with the first semiconductor layer 141 so that the charge carriers may be injected into the epitaxial layered structure 14, thereby reducing the EOS. In certain embodiments, a ratio of the first length (L1) to the second length (L2) is greater than or equal to 2:1, i.e., L1≥2L2, so that the contact area is sufficient for charge carriers to be transferred downward in a direction opposite to the first direction (Z).

The insulating structure 15 may include an insulating material, such as silicon dioxide, silicon nitride, titanium dioxide, tantalum oxide, niobium oxide, barium titanate or combinations thereof. The insulating structure 15 may include a diffracted Bragg reflector (DBR) that is formed out of a periodic structure of layers of two of the aforementioned materials, which are repetitively stacked.

A portion of the insulating structure 15 is disposed at a location corresponding to a region beneath where the second body portion 322 and the second extending portion 324 are connected (abbreviated hereinafter "second connecting region"). With this arrangement, holes in the second semiconductor layer 143 may spread towards an end of each of the second extending portions 324 rather than directly be transferred downward into the light emitting layer 142 of epitaxial layered structure 14. Moreover, the insulating structure 15 is not disposed at a location corresponding to a region beneath where the first body portion 312 and the first extending portion 314 are connected (abbreviated hereinafter "first connecting region," i.e., the insulating structure 15 is not disposed at a location corresponding to a region beneath the first sub-part 111, and an area of the projection of the first body portion 312 on the first semiconductor layer 141 is greater than an area of the projection of the insulating structure 15 beneath the first body portion 312 on the first semiconductor layer 141), so that the first electrode 31 is directly and electrically connected to the first semiconductor layer 141. In this case, electrons in the first semiconductor layer 141 may be injected from the first connecting region, and recombine with the holes to increase the lighting performance of the LED device 10. In addition, since the first length (L1) is greater than the second length (L2), the first connecting region and a peripheral region around the first connecting region may have sufficient area for electrons to be injected into the first semiconductor layer 141. Therefore, the recombination of electrons and holes may be enhanced and a high concentration of accumulated charge carriers may be avoided so as to effectively reduce the EOS. In certain embodiments, the insulating structure 15 is further disposed at a location corresponding to a peripheral region around the second connecting region, so that the lighting performance of the LED device 10 may be enhanced further.

A projection of each of the second parts 13 on the first semiconductor layer 141 independently has a third length (L3) measured in the second direction (X). A ratio of the second length (L2) to the third length (L3) ranges from 1:1.5 to 1:5 such as from 1:2 to 1:4. By adjusting the ratio of the second length (L2) to the third length (L3) within the aforesaid range, the first extending portion 314 may have a sufficient contact area with the first semiconductor layer 141 for charge carriers to be injected thereinto, so as to avoid excess potential difference across the LED device 10 and increase the performance of the LED device 10. In addition, adjusting the ratio may also ensure that the insulating structure 15 and the first electrode 31 (e.g., the first extending portion 314) disposed thereon cooperatively form a reflecting region with sufficient area, so as to improve the brightness of the LED device 10. In certain embodiments, the projection of each of the second parts 13 on the first semiconductor layer 141 has substantially the same length (L3) measured in the second direction (X). In certain embodiments, the second parts 13 of the first extending portion 314 are equally spaced apart from one another along the second direction (X), i.e., the projection of each of the second sub-parts 112 on the first semiconductor layer 141 has the same length (L2). In certain embodiments, each of the first length (L1), the second length (L2) and the third length (L3) is measured in the same direction, i.e., the second direction (X).

In this embodiment, the insulating structure 15 includes a first current blocking portion 16 and a plurality of second current blocking portions 18.

The first current blocking portion 16 is disposed between the first body portion 312 and the first semiconductor layer 141 in the first direction (Z). The second current blocking portions 18 are disposed between the first extending portion 314 of the first electrode 31 and the first semiconductor layer 141 in the first direction (Z) and are spaced apart from one another along the second direction (X). The first current blocking portion 16 is spaced apart from the second current blocking portions 18.

The projection of the first part 11 of the first extending portion 314 on the first semiconductor layer 141 does not overlap a projection of any one of the second current blocking portions 18 on the first semiconductor layer 141. The projection of each of the second parts 13 of the first extending portion 314 on the first semiconductor layer 141 entirely overlaps a projection of a respective one of the second current blocking portions 18 on the first semiconductor layer 141. In other words, in this embodiment, the first length (L1) also refers to a distance measuring from a connecting point of the first body portion 312 and the first extending portion 314 to one of the second current blocking portions 18 closest to the connecting point; the second length (L2) also refers to a distance between two adjacent ones of the second current blocking portions 18; and the third length (L3) also refers to a length of each of the second current blocking portions 18. If the second current blocking portions 18 are not equally spaced apart from one another along the second direction (X), the second length (L2) may then refer to a maximum distance between two adjacent ones of the second current blocking portions 18. In this embodiment, since the first length (L1) is greater than the second length (L2), a region located between the first body portion 312 and one of the second current blocking portions 18 closest to the first body portion 312 may have an increased concentration of charge carriers and a relatively larger contact area with the first semiconductor layer 141, so as to facilitate transfer of charge carriers downward in the first direction (Z), thereby avoiding the accumulation of charge carriers and preventing the LED device 10 from burnout caused by large current.

In certain embodiments, the projection of the first body portion 312 on the first semiconductor layer 141 fully covers the projection of the first current blocking portion 16 on the first semiconductor layer 141, and the projection of the first extending portion 314 on the first semiconductor layer 141 fully cover the projection of each of the second current blocking portions 18. In this embodiment, the second current blocking portions 18 are equally spaced apart from one another along the second direction (X), i.e., a distance between two adjacent ones of the second current blocking portions 18 is the same. In certain embodiments, each of the projections of the second current blocking portions 18 on the first semiconductor layer 141 has substantially the same length (i.e., L3) measured in the second direction (X).

Each of the first current blocking portion 16 and the second current blocking portions 18 may block the current that passes directly from the metal electrode to the semiconductor layer beneath the metal electrode (i.e., from the first electrode 31 to the first semiconductor layer 141) in a direction opposite to the first direction (Z) so that the current may be more uniformly spread in a horizontal direction (i.e. along the second direction (X)) and current crowding may be reduced, thereby increasing the light extraction efficiency of the LED device 10. Each of the first current blocking portion 16 and the second current blocking portions 18 may independently include an insulating material such as silicon oxide, silicon nitride aluminum oxide, or combinations thereof. In certain embodiments, each of the first current blocking portion 16 and the second current blocking portions 18 may have a monolayer structure or a multilayered structure, such as DBR.

In certain embodiments, the insulating structure 15 further includes a third current blocking portion 20 that is disposed between the second electrode 32 and the second semiconductor layer 143 in the first direction (Z) for blocking current, and that is disposed at a location corresponding to the second connecting region (i.e., the region beneath where the second body portion 322 and the second extending portion 324 are connected to each other). A projection of the first extending portion 314 on the first semiconductor layer 141 has a longitudinal side in the second direction (X) that is distanced from a longitudinal side of each of the projections of the second current blocking portions 18 on the first semiconductor layer 141 in the second direction (X) by a first minimum distance (S1). A projection of the second extending portion 324 on the second semiconductor layer 143 has a longitudinal side in the second direction (X) that is distanced from a longitudinal side of the third current blocking portion 20 in the second direction (X) by a second minimum distance (S2). In other words, the first minimum distance (S1) or the second minimum distance (S2) is a distance between the longitudinal side of the projection of a corresponding one of the current blocking portions and a longitudinal side of the projection of a corresponding one of the electrodes. For example, the second minimum distance (S2) refers to a distance between a left longitudinal side of the third current blocking portion 20 and a left longitudinal side of the second electrode 32 along the third direction (Y). The second minimum distance (S2) may also refer to a distance between a point of the projection of the third current blocking portion 20 farthest away from the second body portion (322) and a point of the projection of the second electrode 32 farthest away from the second body portion (322). In certain embodiments, the first minimum distance (S1) or the second minimum distance (S2) may be obtained by subtracting a width of the projection of a corresponding one of the current blocking portions from a width of the projection of a corresponding one of the electrodes and dividing the difference resulted therefrom by two.

In this embodiment, the first minimum distance (S1) is smaller than the second minimum distance (S2) so that each of the second current blocking portions 18 may not formed with a stage-like edge which contacts the light emitting layer 142 and the second semiconductor layer 143, thereby enhancing the performance and the yield of the LED device 10.

In certain embodiments, the LED device 10 further includes a current spreading layer 22 that is disposed on the third current blocking portion and substantially entirely covers the second semiconductor layer 143 and the third current blocking portion 20 for current spreading so that a uniform current distribution may be achieved and the light exiting performance of the LED device may be enhanced. The current spreading layer 22 may include a transparent and electrically conductive material (e.g., a transparent and electrically conductive oxide) so as to increase the reliability of the LED device 10. The transparent and electrically conductive material may be, but is not limited to, indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium doped zinc oxide (GZO), tungsten doped indium oxide (IWO), zinc oxide (ZnO) or combinations thereof.

The LED device 10 may further include an insulating feature 40 covering the epitaxial layered structure 14. To be specific, the insulating feature is disposed on the second semiconductor layer 143, the first semiconductor layer 141 and side surfaces of the epitaxial layered structure 14. The insulating feature 40 further covers the current spreading layer 22, the first electrode 31, the second electrode 32, and a surface of the substrate 12 that is exposed from the epitaxial layered structure 14. The insulating feature 40 is formed with two openings exposing the first electrode 31 and the second electrode 32, respectively. The insulating feature 40 may perform different functions depending on its location in the LED device 10. For example, the insulating feature 40 covering the side surfaces of the epitaxial layered structure 14 may prevent electrically conductive material(s) from electrically connecting to the first semiconductor layer 141 and the second semiconductor layer 143, thereby avoiding a short circuit of the LED device 10.

In certain embodiments, the insulating feature 40 includes a non-conductive material such as an inorganic material (e.g., silicone) or a dielectric material. Examples of the dielectric material may include, but are not limited to, aluminum oxide (AlO), silicon nitride (SiNx), silicon oxide (SiOx), titanium oxide (TiOx), magnesium fluoride (MgFx), tantalum oxide, niobium oxide, barium titanate and combinations thereof. In certain embodiments, the insulating feature 40 may include a diffracted Bragg reflector (DBR) that is formed out of a periodic structure of layers of two of the aforementioned materials, which are repetitively stacked.

In certain embodiments, each of the second extending portions 324 has a ball feature 326 that is disposed at an end farthest from the second body portion 322. In such case, the width (W2) of the projection of each of the second extending portions 324 on the first semiconductor layer 141 is smaller than or equal to 10 μm measured in the third direction (Y) on the first semiconductor layer 141. The ball feature 326 of each of the second extending portions 324 may have a diameter that is greater than or equal to 3 μm so that the operating voltage of the LED device 10 may be reduced, thereby ensuring the optical rotation and light extraction of the LED device 10. It should be noted that in other embodiments, the first extending portion 314 may also have a ball feature (not shown) that is disposed at an end farthest from the first body portion 312, and the dimension of the ball feature of the first extending portion 314 may be similar to or identical to that of the ball feature 326 of the second extending portions 324.

Referring to FIGS. 4 to 8, consecutive steps for manufacturing the first embodiment of the LED device 10 are illustrated and described as follows. It should be noted that the shadow region depicted in each of FIGS. 5 to 8 represents an additional feature formed by a corresponding step in a given figure as compared to the previous figure. In addition, for sake of simplicity, the contour of each of the components shown in FIGS. 4 to 8 as well as in FIGS. 1 and 2 are depicted with solid lines.

Figure 4:
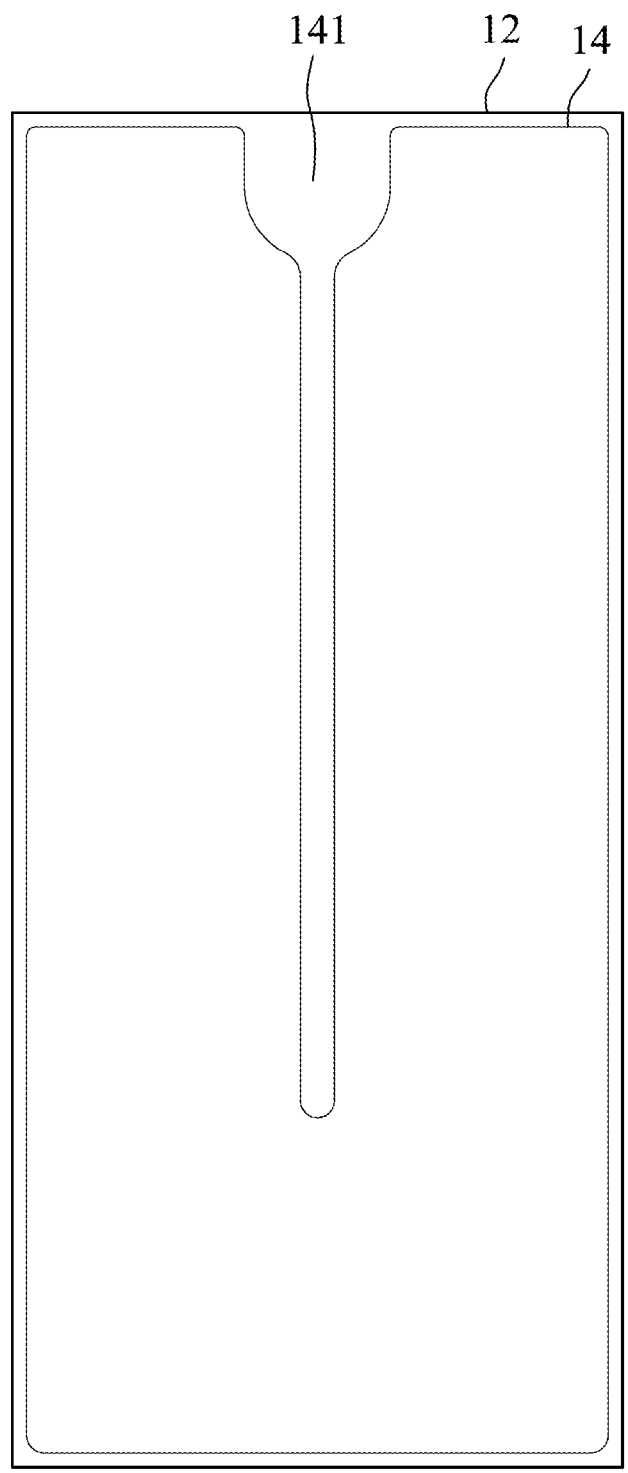
FIGS. 4 to 8 are schematic top views illustrating consecutive steps for manufacturing the first embodiment of the LED device.

Referring to FIGS. 1, 3 and 4, the epitaxial layered structure 14 that includes the first semiconductor layer 141, the light emitting layer 142 and the second semiconductor layer 143 is first formed on a substrate surface of the substrate 12. Then, the epitaxial layered structure 14 is etched in a direction from the second semiconductor layer 143 toward the substrate 12 until a portion of the first semiconductor layer 141 is exposed. In addition, a peripheral portion of the epitaxial layered structure 12 may selectively be etched to expose the substrate surface of the substrate 12, which may facilitate a subsequent step (e.g., cutting) in fabrication.

Figure 5:
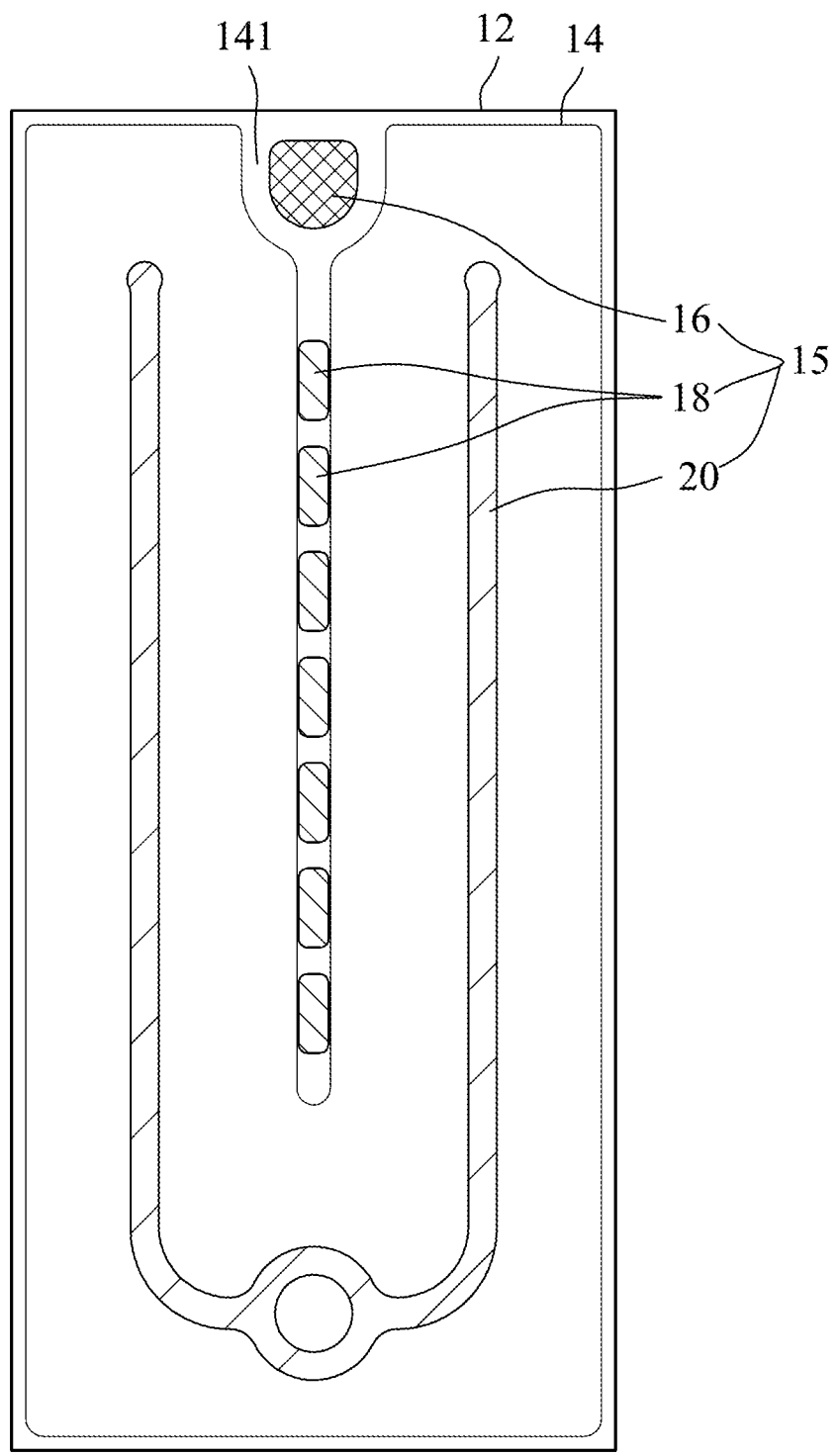

Next, with further reference to FIG. 5, the insulating structure 15 that includes the first current blocking portion 16, the second current blocking portions 18 and the third current blocking portion 20 is formed on the epitaxial layered structure 14 so as to block transfer of the current from the first and second electrodes 31, 32, which are to be formed in the subsequent steps, to the epitaxial layered structure 14 in the first direction (Z). To be specific, the first current blocking portion 16 and the second current blocking portions 18 are disposed on the first semiconductor layer 141, and the third current blocking portion 20 is disposed on the second semiconductor layer 143.

Figure 6:
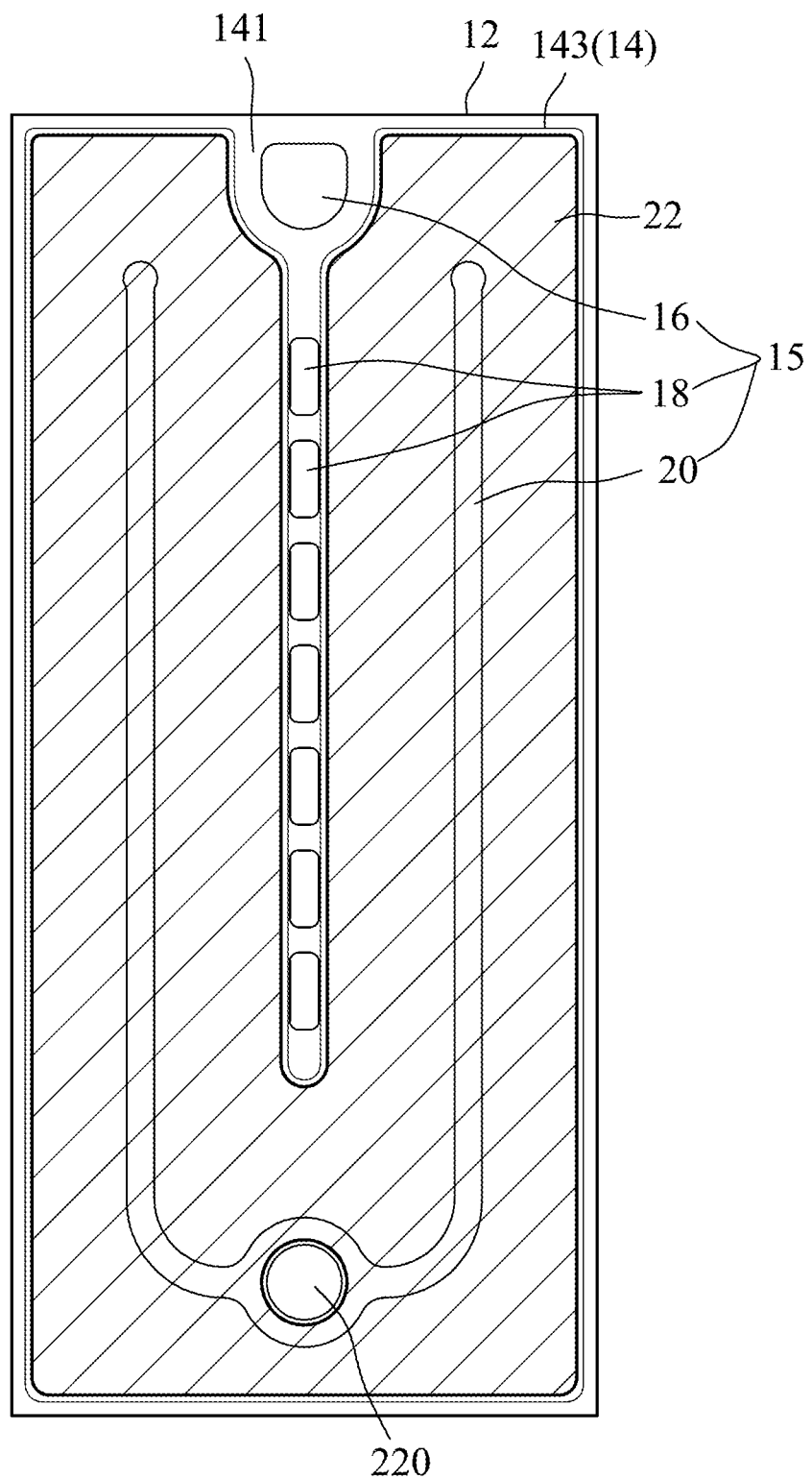

Then, further referring to FIG. 6, the current spreading layer 22 is formed on the second semiconductor layer 143 for spreading current and increasing the reliability of the LED device 10. The current spreading layer 22 is formed with a cavity 220 exposing the second semiconductor layer 143. The current spreading layer 22 is not in contact with the first current blocking portion 16 and the second current blocking portions 18.

Figure 7:
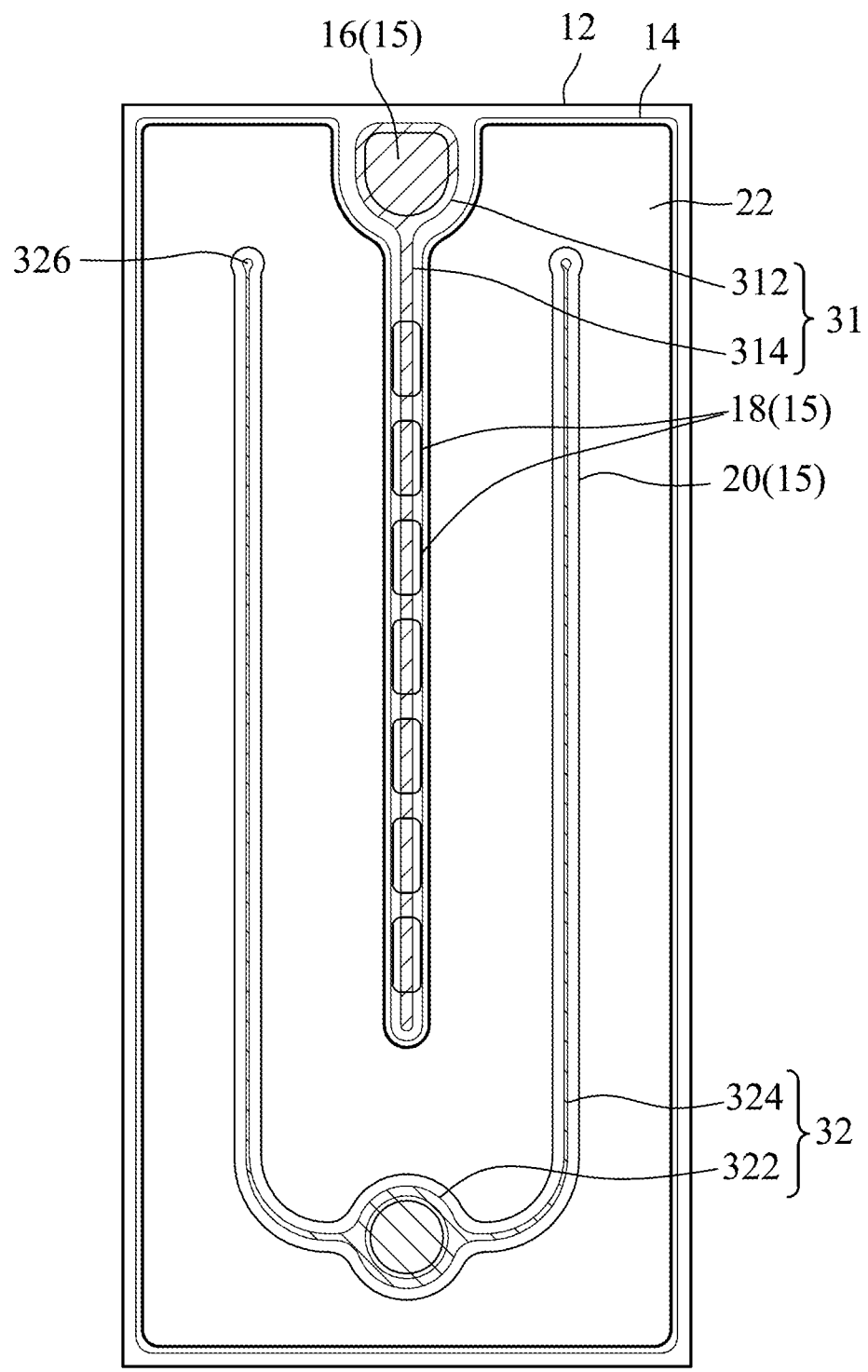
Figure 8:
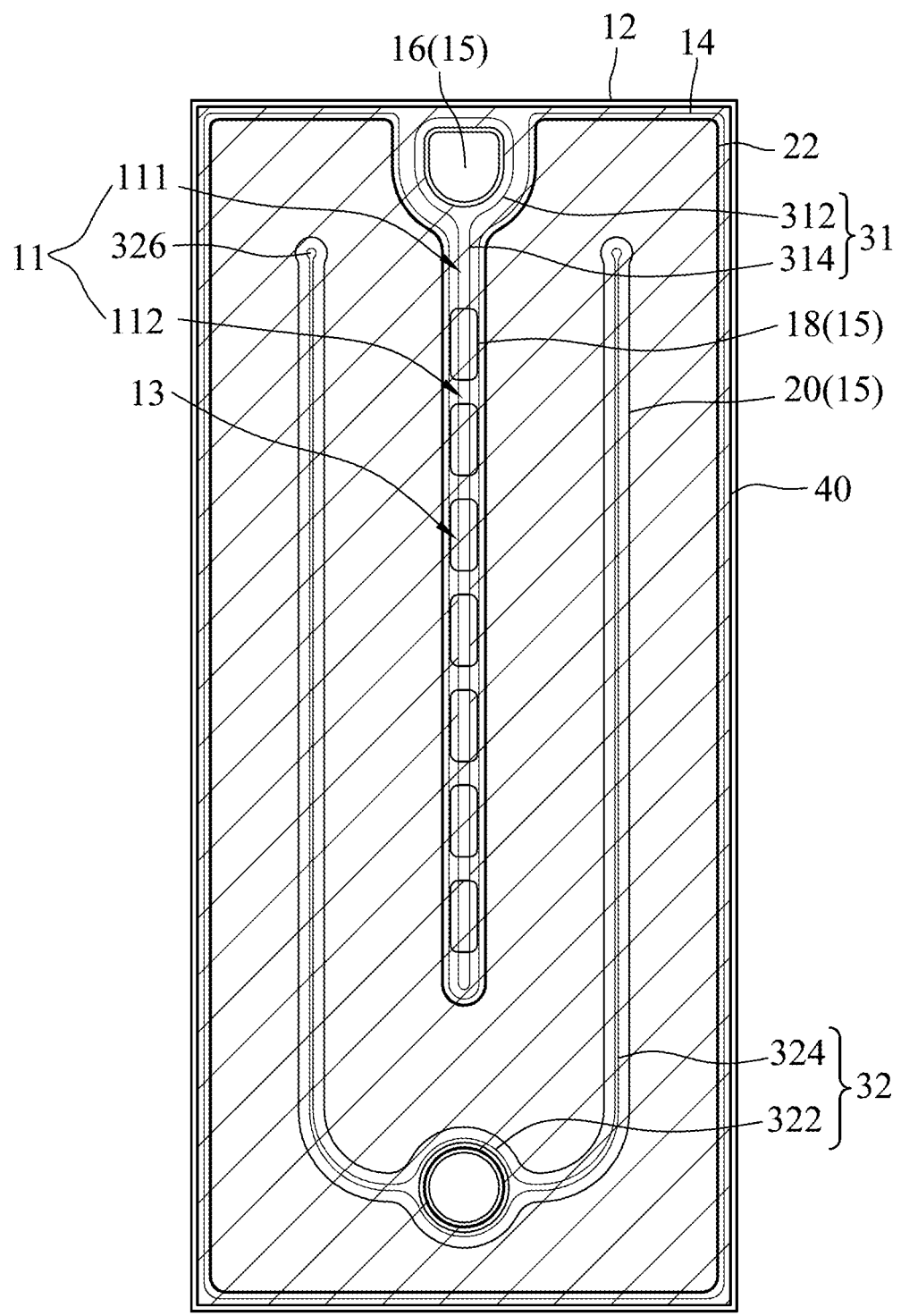

Afterwards, further referring to FIG. 7, the first electrode 31 is formed on the first semiconductor layer 141, the first current blocking portion 16 and the second current blocking portions 18, and the second electrode 32 is formed on the second semiconductor layer 143 and the current spreading layer 22. The second electrode 32 is formed to be electrically connected to the second semiconductor layer 143 through the current spreading layer 22. In certain embodiments, the second body portion 322 of the second electrode 32 covers and fills the cavity 220 of the current spreading layer 22 so that adhesion between the second electrode 32 and the current spreading layer 22 is enhanced, thereby effectively preventing the second electrode 32 from falling off the current spreading layer 22. The first electrode 31 and the second electrode 32 are illustrated with different patterns in FIG. 7 for clarity.

Lastly, the insulating feature 40 is formed to cover the epitaxial layered structure 14 and portions of the first electrode 31 and the second electrode 32. The insulating feature 40 is formed with two openings that exposes the first electrode 31 and the second electrode 32, respectively, for further use. The insulating feature 40 is configured to isolate electrical conduction and protect components that are covered thereby.

Figure 9:
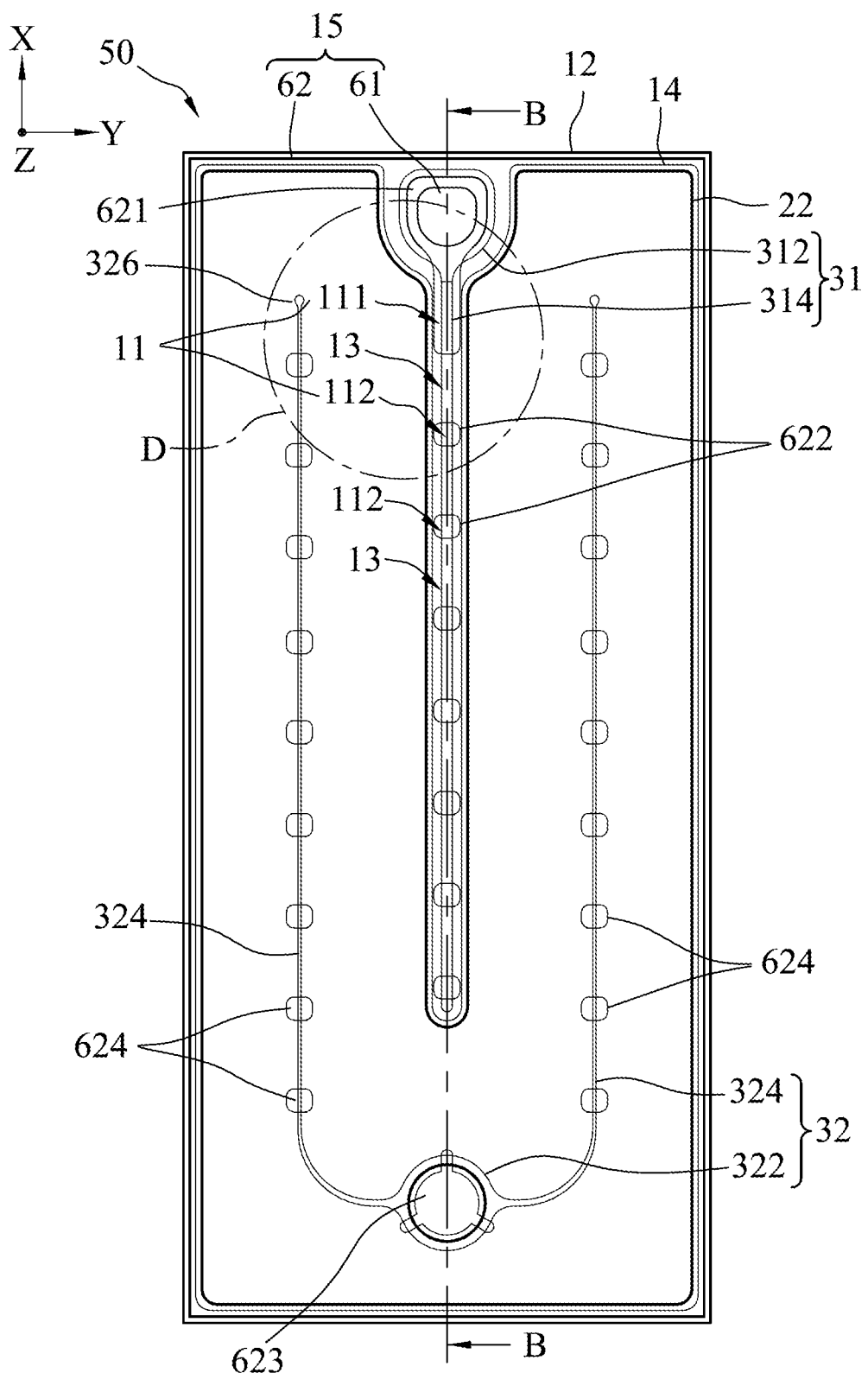
FIG. 9 is a schematic top view illustrating a second embodiment of the LED device according to the disclosure.
Figure 10:
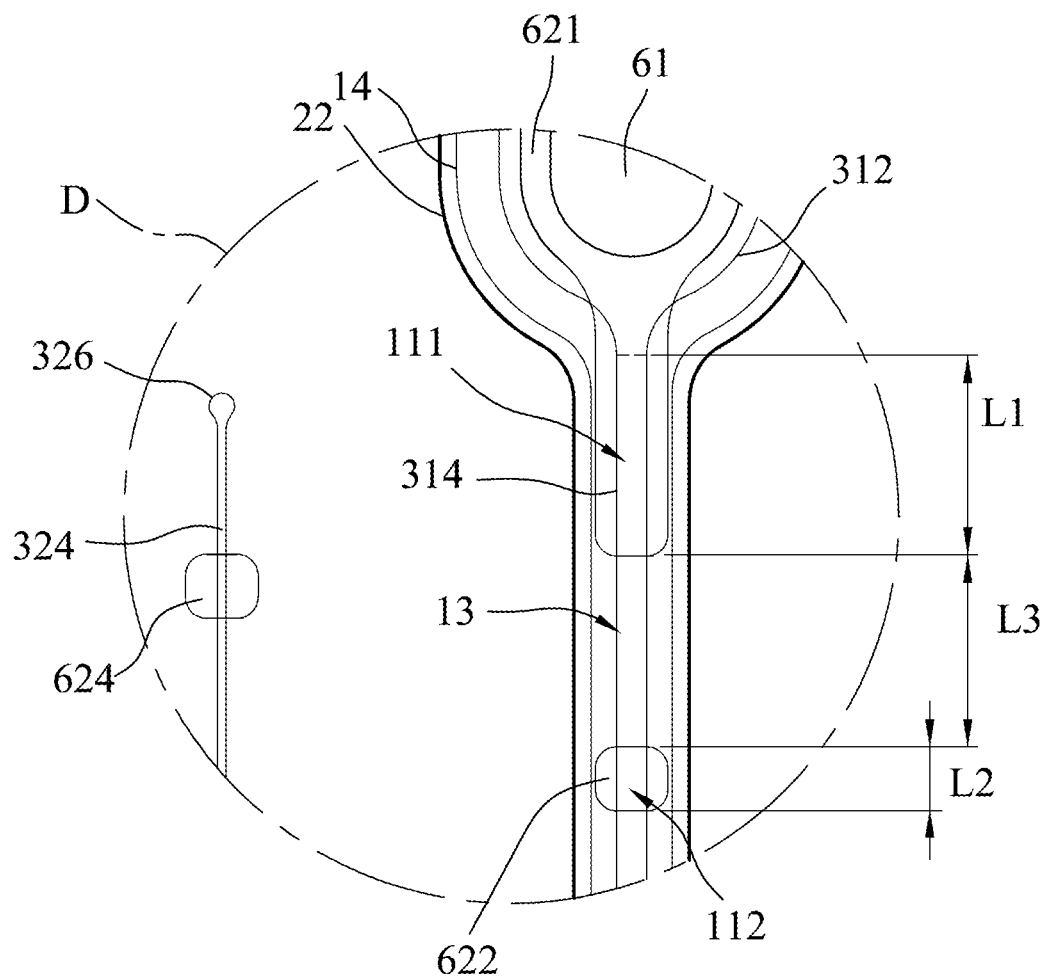
FIG. 10 is an enlarged view of a circular region D of FIG. 9.
Figure 11:
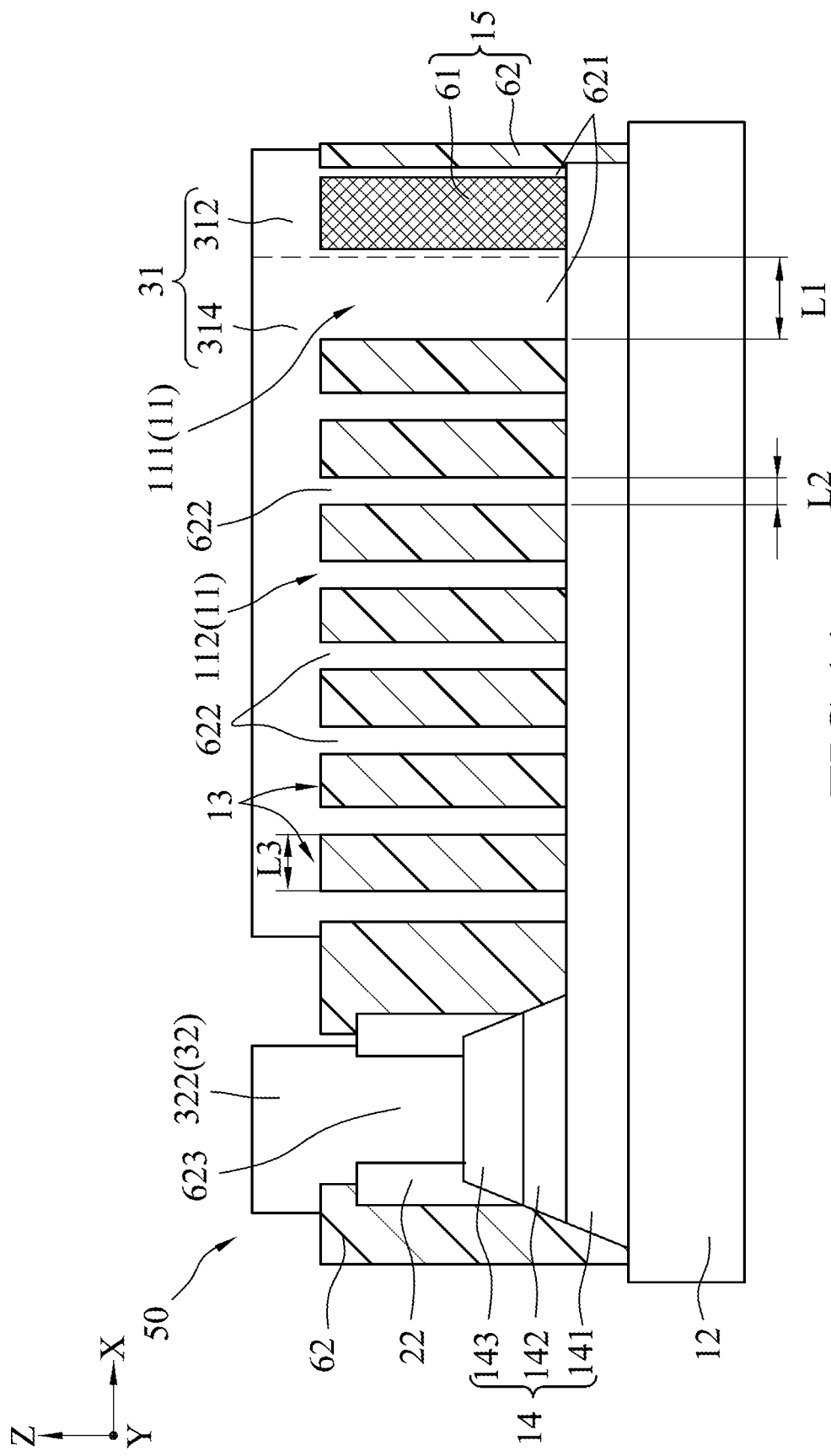
FIG. 11 is a schematic sectional view taking along a line B-B of FIG. 9.

Referring to FIGS. 9 to 11, a second embodiment of the LED device 50 according to the disclosure is generally similar to the first embodiment of the LED device 10, except for the configuration of the insulating structure 15.

Specifically, in the second embodiment, the insulating structure 15 includes a first insulating part 61 that is disposed between the first body portion 312 and the first semiconductor layer 141, and a second insulating part 62 that partially covers the epitaxial layered structure 14. The first insulating part 61 and the second insulating part 62 are separated from each other by a first opening 621 that exposes the first semiconductor layer 141. The second insulating part 62 is formed with a plurality of second openings 622 that expose the first semiconductor layer 141. The first body portion 312 and the first sub-part 111 of the first extending portion 314 fill the first opening 621 to be electrically connected to the first semiconductor layer 141, that is to say, a portion of the first opening 621 is located in a region between the first semiconductor layer 141 and the first body portion 312 in the first direction (Z) and another portion of the first opening 621 is located in a region between the first semiconductor layer 141 and the first extending portion 314 in the first direction (Z). Each of the second sub-parts 112 of the first extending portion 314 is disposed on the second insulating part 62 and fills a respective one of the second openings 622, that is to say, the second openings 622 are located in the region between the first semiconductor layer 141 and the first extending portion 314 in the first direction (Z).

In addition, the second insulating part 62 is further formed with a third opening 623 and a plurality of fourth openings 624 that expose the second semiconductor layer 143. The second body portion 322 of the second electrode 32 is disposed on the second insulating part 62 and extends into the third opening 623 so as to be electrically connected to the second semiconductor layer 143. The second extending portion 324 of the second electrode 32 is disposed on the second insulating part 62 and fills the fourth openings 624, so as to be electrically connected to the second semiconductor layer 143. In other words, the third opening 623 is located in a region between the second body portion 322 and the second semiconductor layer 143 in the first direction (Z). The fourth openings 624 are located in the region between the second extending portion 324 and the second semiconductor layer 143 in the first direction (Z).

In this embodiment, the projection of the first part 11 of the first extending portion 314 on the first semiconductor layer 141 does not overlap a projection of the second insulating part 62 on the first semiconductor layer 141. The projection of each of the second parts 13 of the first extending portion 314 on the first semiconductor layer 141 entirely overlaps the projection of the second insulating part 62 on the first semiconductor layer 141. In other words, in this embodiment, the first length (L1) also refers to a distance from a connecting point of the first body portion 312 and the first extending portion 314 to the first opening 621; the second length (L2) also refers to a length of each of the second openings 622; and the third length (L3) also refers to a distance between two adjacent ones of the second openings 622. By having the first length (L1) to be greater than the second length (L2), a region located between the first body portion 312 and the first opening 621 may have an increased concentration of charge carriers, and a relatively larger contact area with the first semiconductor layer 141, so as to facilitate transfer of charge carriers downward in the first direction (Z), thereby avoiding accumulation of the charge carriers and preventing the LED device 10 from burnout caused by large current. In addition, by adjusting the ratio of the second length (L2) to the third length (L3) within the aforesaid range (i.e., from 1:1.5 to 1:5), the first extending portion 314 may have a sufficient contact area with the first semiconductor layer 141 for charge carriers to be injected thereinto, so as to avoid excess potential difference across the LED device 50 and increase the performance of the LED device 50. Furthermore, adjusting the ratio of L2 to L3 may also ensure that the second insulating part 62 and the first electrode 31 (e.g., the first extending portion 314) disposed thereon to cooperatively form a reflecting region with sufficient area, so as to improve the brightness of the LED device 50.

The second openings 622 may be arranged to be equally spaced apart from one another along the second direction (X). That is to say, a distance between two adjacent ones of the second openings 622 is the same. In certain embodiments, the second openings 622 have the same shape and/or dimensions. In other embodiments, a projection of a wall defining the third opening 623 on the first semiconductor layer 141 partially falls outside a projection of the second body portion 322 on the first semiconductor layer 141 so that holes injected from the second electrode 32 may pass through the current spreading layer 22 for lateral spreading to reduce the potential difference across the LED device 50. In certain embodiments, each of the fourth openings 624 has a maximum width ranging from 5 μm to 20 μm, i.e., each of the fourth openings 624 has a dimension ranging from 5 μm to 20 μm along an extending direction of each of the second extending portions 324, e.g. the second direction (X). A distance between two adjacent ones of the fourth openings 624 may range from 10 μm to 40 μm.

Figure 12:
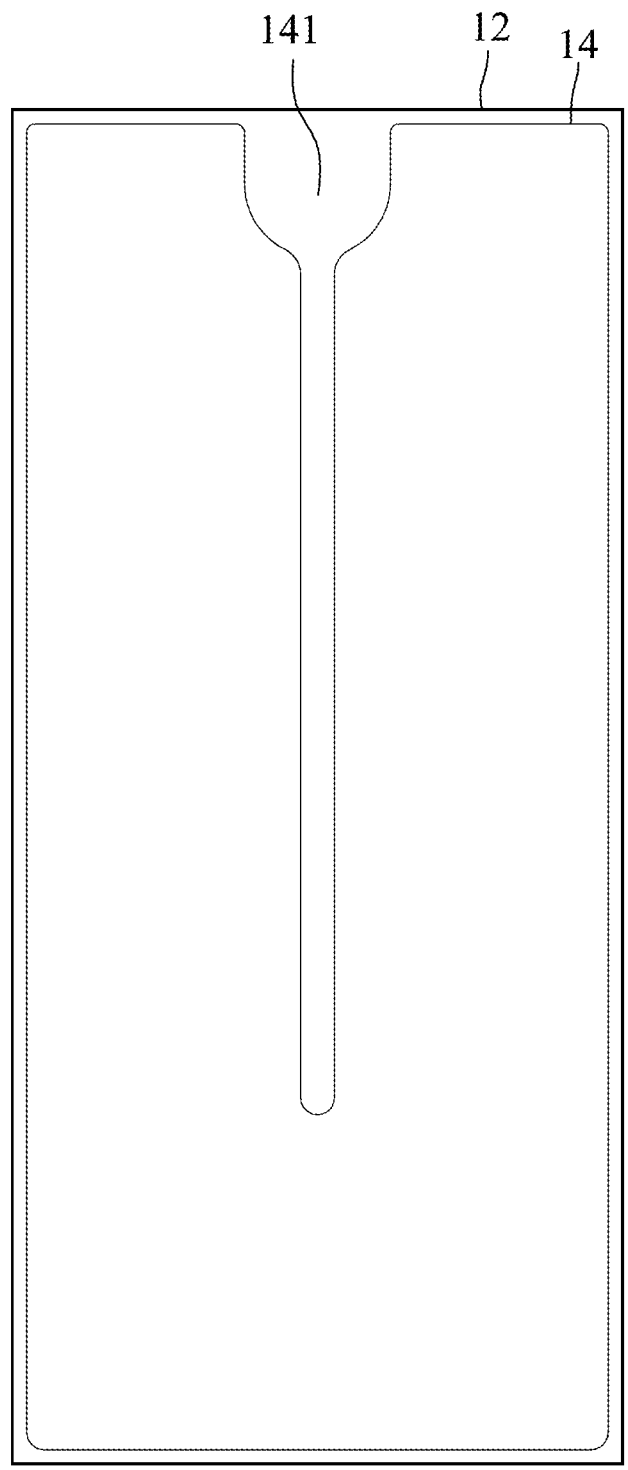
FIGS. 12 to 15 are schematic top views illustrating consecutive steps for manufacturing the second embodiment of the LED device.
Figure 13:
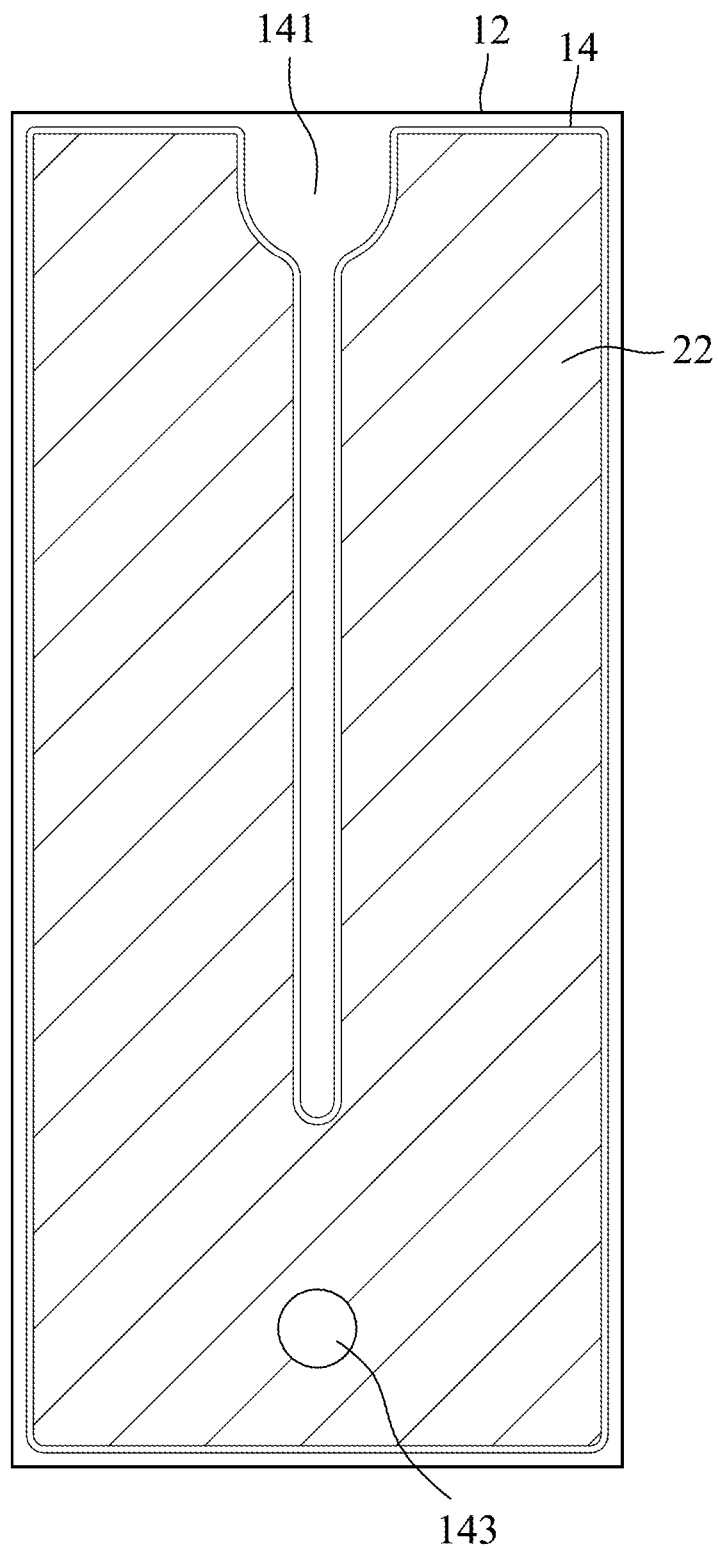
Figure 14:
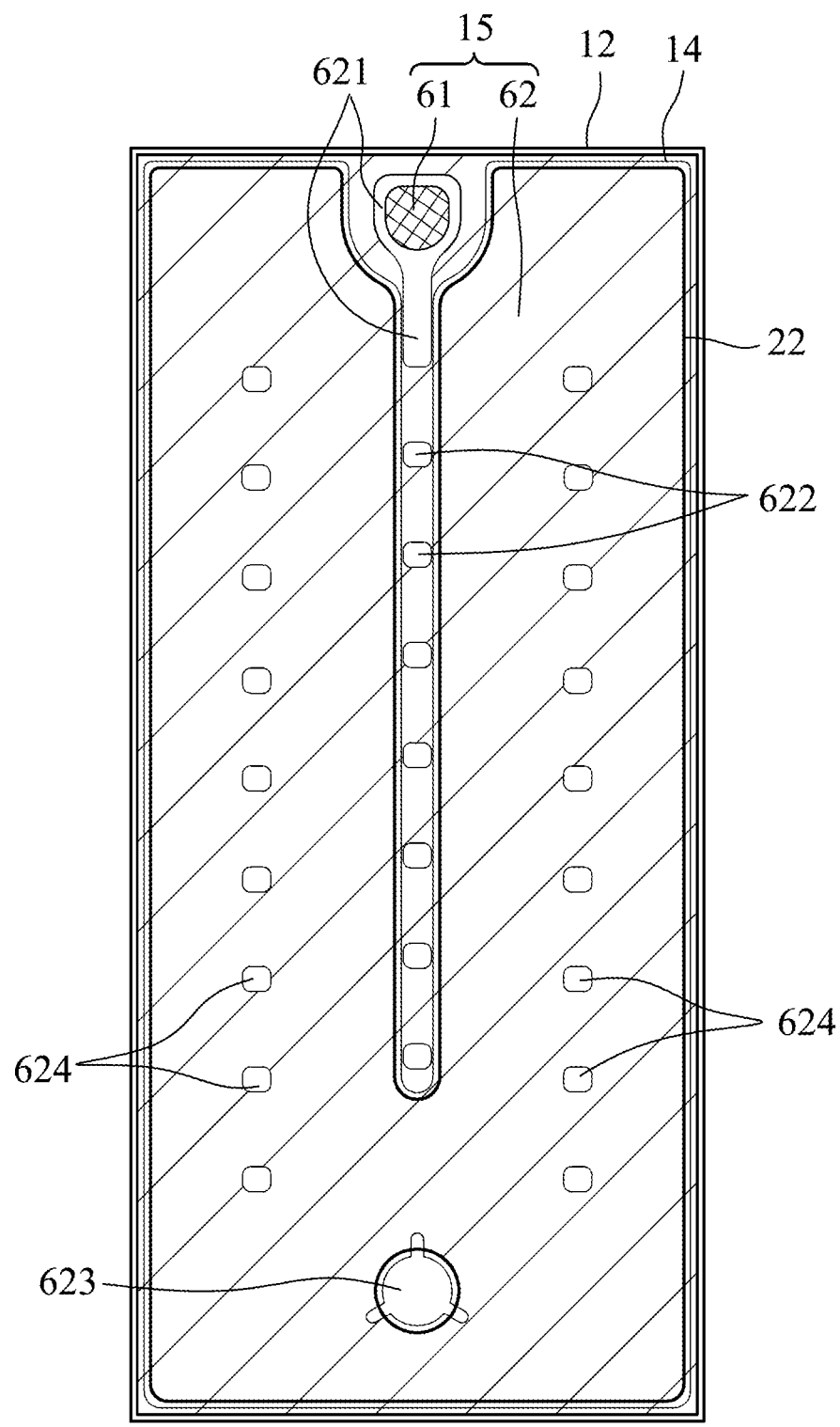
Figure 15:
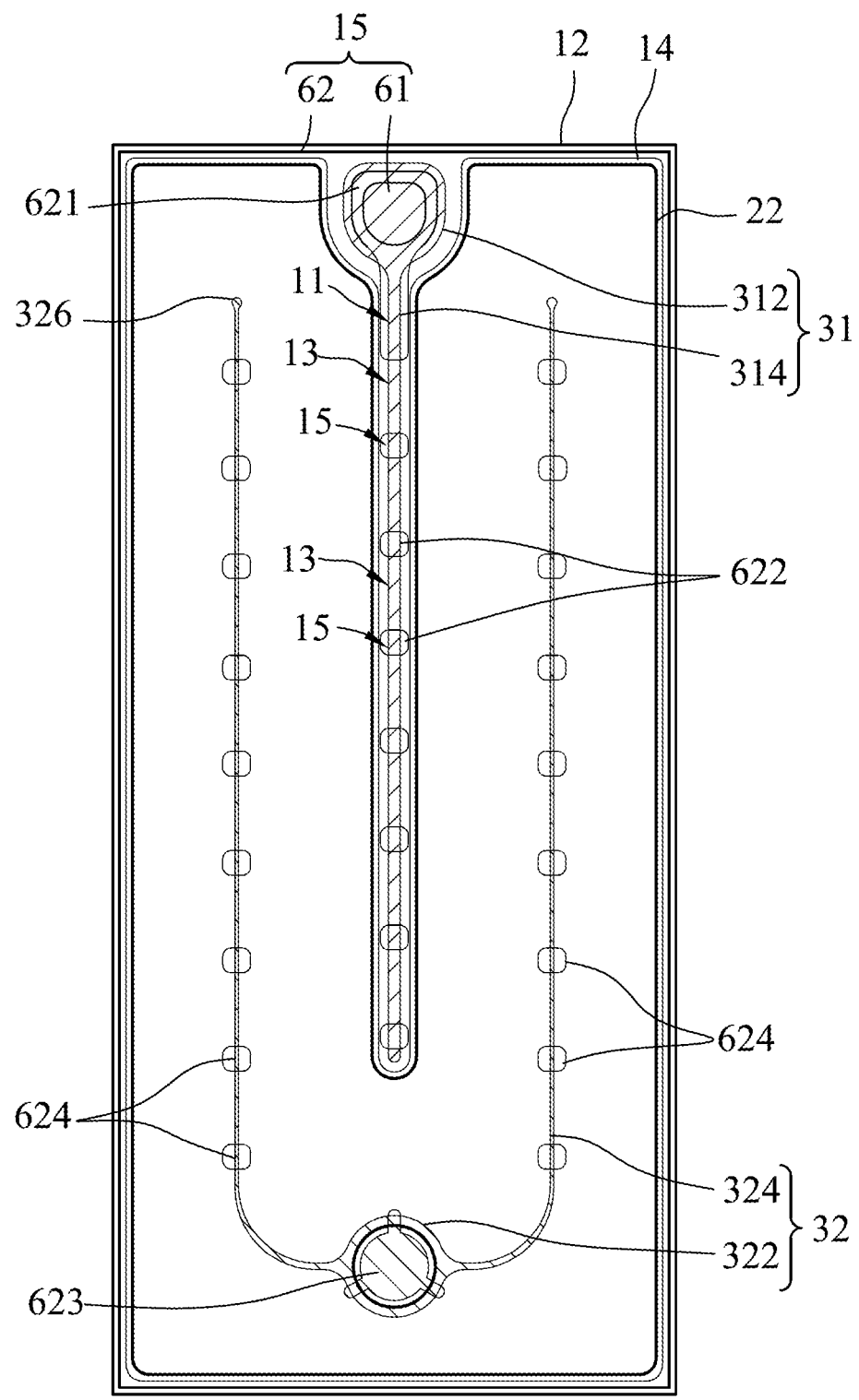

Referring to FIGS. 12 to 15, consecutive steps for manufacturing the first embodiment of the LED device 50 are illustrated and described as follows. It should be noted that the shadow region depicted in each of FIGS. 13 to 15 represents an additional feature formed by a corresponding step in a given figure as compared to the previous figure. In addition, for sake of simplicity, the contour of each of the components shown in FIGS. 12 to 15 as well as in FIGS. 9 and 10 are depicted with solid lines.

Referring to FIGS. 9, 11 and 12, the epitaxial layered structure 14 that includes the first semiconductor layer 141, the light emitting layer 142 and the second semiconductor layer 143 is first formed on the substrate surface of the substrate 12. Then, the epitaxial layered structure 14 is etched in a direction from the second semiconductor layer 143 toward the substrate 12 until a portion of the first semiconductor layer 141 is exposed. In addition, a peripheral portion of the epitaxial layered structure 12 may selectively be etched to expose the substrate surface, which may facilitate a subsequent step (e.g., cutting) in fabrication.

Next, with further reference to FIG. 13, the current spreading layer 22 is formed on the second semiconductor layer 143 for spreading current and increasing the reliability of the LED device 50. The current spreading layer 22 is formed with a cavity 220 exposing the second semiconductor layer 143. The current spreading layer 22 is not in contact with the first semiconductor layer 141.

Then, further referring to FIG. 14, the insulating structure 15 that includes the first insulating part 61 and the second insulating part 62 is formed on the epitaxial layered structure 14 so as to block transfer of the current between the first and second electrodes 31, 32, which are to be formed in the subsequent steps, to the epitaxial layered structure 14 in the first direction (Z). For clarity, the first insulating part 61 and the second insulating part 62 are illustrated with different patterns in FIG. 14. To be specific, the first insulating part 61 is formed on the exposed first semiconductor layer 141 and the second insulating part 62 is formed on the second semiconductor layer 143. The first insulating part 61 and the second insulating part 62 are separated from one another by the first opening 621. The second insulating part 62 is formed with the second openings 622 on the exposed first semiconductor layer 141, and the third opening 623 on the exposed second semiconductor layer 143 (i.e., the third opening 623 and the cavity 220 are spatially communicated with each other) and is formed with the fourth openings 624 that extend through the current spreading layer 22 and expose the second semiconductor layer 143.

Afterwards, referring to FIG. 15, the first electrode 31 is formed on the first semiconductor layer 141, the first insulating part 61 and the second insulating part 62, and the second electrode 32 is formed on the second semiconductor layer 143 and the current spreading layer 22. To be specific, the first body portion 312 and the first extending portion 314 respectively fill the first opening 621 and the second openings 622 in such manner that the first electrode 31 is electrically connected to the first semiconductor layer 141. The second body portion 322 fills the third opening 623 and the second extending portion 324 fills the fourth openings 624 in such manner that the second electrode 32 is electrically connected to the current spreading layer 22 and the second semiconductor layer 143. In certain embodiments, the second body portion 322 of the second electrode 32 covers and fills the cavity of the current spreading layer 22 so that adhesion between the second electrode 32 and the current spreading layer 22 may be enhanced, thereby effectively preventing the second electrode 32 from falling off the current spreading layer 22. The first electrode 31 and the second electrode 32 are illustrated with different patterns in FIG. 15 for clarity.

In certain embodiments, the first length (L1) of the projection of the first sub-part 111 on the first semiconductor layer 141 ranges from 30 μm to 70 μm. In other embodiments, the second length (L2) of the projection of each of the second sub-parts 112 on the first semiconductor layer 141 ranges from 10 μm to 20 μm. In still other embodiments, the third length (L3) of the projection of each of the second parts 13 on the first semiconductor layer 141 that is measured in the second direction (X) ranges from 30 μm to 60 μm. By controlling the first length, the second length and/or the third length, the LED device 10, 50 of this disclosure may deliver better performance.

In summary, by having the first length (L1) be greater than the second length (L2), the LED device 10, 50 of this disclosure may have a sufficient contact area between the first electrode 31 and the first semiconductor layer 141 for charge carriers to be injected into the epitaxial layered structure 14 thereby reducing the EOS. Furthermore, by disposing a portion of the insulating structure 15 at a location corresponding to the region beneath where the second body portion 322 and the second extending portion 324 are connected, and by making the projection of the first part 11 of the first extending portion 314 on the first semiconductor layer 141 not overlapping the projection of the insulating structure 15 on the first semiconductor layer 141 (i.e., making the first part 11 in directly contact with the first semiconductor layer 141), holes in the second semiconductor layer 143 may be laterally distributed in a direction away from the second body portion 211 towards the end of the second extending portion 324 (i.e., in the third direction (X)) rather than passing through the epitaxial layered structure 14 in the first direction (Z), and electrons in the first semiconductor layer 141 may be injected into the connecting region between the first body portion 312 and the first extending portion 314 to be recombined with the holes, thereby increasing the lighting performance of the LED device 10, 50.

Additionally, by optimizing the ratio of the second length (L2) to the third length (L3), a sufficient contact area between the first extending portion 314 and the first semiconductor layer 141 and a sufficient injecting area for charge carriers may be ensured to avoid excess voltage and enhance the performance of the LED device 10, 50. The insulating structure 15 and the first electrode 31 (e.g., the first extending portion 314) disposed thereon may cooperate to form a reflecting region with sufficient area, so as to increase the brightness of the LED device 10, 50.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting diode (LED) device, comprising:
    an epitaxial layered structure that includes a first semiconductor layer, a light emitting layer and a second semiconductor layer sequentially disposed in such an order along a first direction;
    a first electrode that is disposed on said epitaxial layered structure and that is electrically connected to said first semiconductor layer, said first electrode including a first body portion and a first extending portion connected to said first body portion;
    a second electrode that is disposed on said epitaxial layered structure and that is electrically connected to said second semiconductor layer, said second electrode including a second body portion and at least one second extending portion connected to said second body portion, said first extending portion extending from said first body portion toward said second body portion, and said second extending portion extending from said second body portion of said second electrode toward said first body portion; and
    an insulating structure that is disposed between said first semiconductor layer and said first electrode, and between said second semiconductor layer and said second electrode, a portion of said insulating structure being disposed at a location corresponding to a region beneath where said second body portion and said second extending portion are connected,
    wherein said first extending portion includes a first part and a plurality of second parts, a projection of said first part on said first semiconductor layer does not overlap a projection of said insulating structure on said first semiconductor layer, and a projection of each of said second parts entirely overlaps the projection of said insulating structure on said first semiconductor layer, said first part having a first sub-part that is located between said first body portion and one of said second parts closest to said first body portion, and a plurality of second sub-parts that are separated from one another by said second parts,
    wherein a projection of said first sub-part on said first semiconductor layer has a first length measured in a second direction perpendicular to the first direction on said first semiconductor layer, and a projection of each of said second sub-parts on said first semiconductor layer independently has a second length measured in the second direction, and wherein the first length is greater than the second length, and
    wherein a projection of each of said second parts on said first semiconductor layer independently has a third length measured in the second direction and a ratio of the second length to the third length ranges from 1:1.5 to 1:5.

2. The LED device as claimed in claim 1, wherein a ratio of the first length to the second length is greater than or equal to 2:1.

3. The LED device as claimed in claim 1, wherein the first length ranges from 30 μm to 70 μm and the second length ranges from 10 μm to 20 μm.

4. The LED device as claimed in claim 1, wherein the third length ranges from 30 μm to 60 μm.

5. The LED device as claimed in claim 1, wherein said second parts of said first extending portion are equally spaced apart from one another along the second direction.

6. The LED device as claimed in claim 1, wherein a projection of each of said second parts on said first semiconductor layer has the same length measured in the second direction.

7. The LED device as claimed in claim 1, wherein said insulating structure includes a first current blocking portion that is disposed between said first body portion and said first semiconductor layer, and a plurality of second current blocking portions that are disposed between said first extending portion of said first electrode and said first semiconductor layer and that are spaced apart from one another along the second direction, each of projections of said second parts of said first extending portion on said first semiconductor layer entirely overlapping a respective one of projections of said second current blocking portions on said first semiconductor layer.

8. The LED device as claimed in claim 7, wherein said second current blocking portions are equally spaced apart from one another along the second direction.

9. The LED device as claimed in claim 7, wherein the projections of said second current blocking portions on said first semiconductor layer have the same length measured in the second direction.

10. The LED device as claimed in claim 7, wherein:
said second electrode includes two second extending portions that are connected to two opposite sides of said second body portion,
a projection of said first extending portion on said first semiconductor layer has a first width measured in a third direction that is perpendicular to the second direction on said first semiconductor layer and each of projections of said second extending portions on said first semiconductor layer has a second width measured in the third direction, the first width being greater than the second width, and
the projection of said first extending portion on said first semiconductor layer is located between the projections of said two second extending portions along the third direction.

11. The LED device as claimed in claim 7, wherein:
said insulating structure further includes a third current blocking portion that is disposed between said second electrode and said second semiconductor layer,
a projection of said first extending portion on said first semiconductor layer has a longitudinal side in the second direction that is distanced from a longitudinal side of each of projections of said second current blocking portions on said first semiconductor layer in the second direction by a first minimum distance, and a projection of said second extending portion on said second semiconductor layer has a longitudinal side in the second direction that is distanced from a longitudinal side of said third current blocking portion in the second direction by a second minimum distance, and the first minimum distance is smaller than the second minimum distance.

12. The LED device as claimed in claim 7, wherein each of a projection of said first extending portion on said first semiconductor layer and a projection of said second extending portion on said first semiconductor layer has a width that is smaller than or equal to 10 μm measured in a third direction that is perpendicular to the second direction on said first semiconductor layer.

13. The LED device as claimed in claim 7, wherein said second extending portion has a ball feature that is disposed at an end farthest from said second body portion, and wherein said ball feature of said second extending portion has a diameter greater than or equal to 3 μm.

14. The LED device as claimed in claim 1, wherein:
said insulating structure includes a first insulating part that is disposed between said first body portion and said first semiconductor layer and a second insulating part that partially covers said epitaxial layered structure,
said first insulating part and said second insulating part are separated from each other by a first opening that exposes said first semiconductor layer, and said first body portion and said first sub-part of said first extending portion fills said first opening to be electrically connected to said first semiconductor layer, and
said second insulating part is formed with a plurality of second openings that expose said first semiconductor layer, each of said second sub-parts of said first extending portion is disposed on said second insulating part and fills a respective one of said second openings, a projection of said first part on said first semiconductor layer does not overlap a projection of said second insulating part on said first semiconductor layer, and each of projections of said second parts on said first semiconductor layer entirely overlaps the projection of said second insulating part on said first semiconductor layer.

15. The LED device as claimed in claim 14, wherein said second openings have a same shape and same dimensions.

16. The LED device as claimed in claim 14, wherein said second openings are arranged and equally spaced apart from one another along the second direction.

17. The LED device as claimed in claim 14, wherein:
said second insulating part is further formed with a third opening and a plurality of fourth openings that expose said second semiconductor layer,
said second body portion of said second electrode is disposed on said second insulating part and extends into said third opening to be electrically connected to said second semiconductor layer, and
said second extending portion of said second electrode is disposed on said second insulating part and fills said fourth openings to be electrically connected to said second semiconductor layer.

18. The LED device as claimed in claim 14, wherein a projection of said third opening on said first semiconductor layer partially falls outside a projection of said second body portion on said first semiconductor layer.

19. The LED device as claimed in claim 14, wherein each of said fourth openings has a maximum width ranging from 5 μm to 20 μm and a distance between two adjacent ones of said fourth openings ranges from 10 μm to 40 μm.

* * * * *